(12) United States Patent
Cheng et al.

(10) Patent No.: US 10,714,523 B2
(45) Date of Patent: Jul. 14, 2020

(54) ISOLATION STRUCTURE AND IMAGE SENSOR

(71) Applicant: TAIWAN SEMICONDUCTOR MANUFACTURING CO., LTD., Hsinchu (TW)

(72) Inventors: Yun-Wei Cheng, Taipei (TW); Chun-Wei Chia, Kaohsiung (TW); Chun-Hao Chou, Tainan (TW); Kuo-Cheng Lee, Tainan (TW); Hsun-Ying Huang, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/222,649

(22) Filed: Dec. 17, 2018

(65) Prior Publication Data
US 2019/0139998 A1 May 9, 2019

Related U.S. Application Data

(63) Continuation of application No. 15/458,131, filed on Mar. 14, 2017, now Pat. No. 10,157,949.

(51) Int. Cl.
*H01L 27/146* (2006.01)

(52) U.S. Cl.
CPC .... *H01L 27/1463* (2013.01); *H01L 27/14627* (2013.01); *H01L 27/14643* (2013.01); *H01L 27/14689* (2013.01); *H01L 27/14621* (2013.01)

(58) Field of Classification Search
CPC ........... H01L 27/1463; H01L 27/14643; H01L 27/14689; H01L 27/14627; H01L 27/14621
See application file for complete search history.

(56) References Cited

U.S. PATENT DOCUMENTS

| 6,046,487 A | 4/2000 | Benedict et al. |
| 2013/0069190 A1* | 3/2013 | Kao ..................... H01L 27/1463 257/432 |

* cited by examiner

*Primary Examiner* — Kyoung Lee
(74) *Attorney, Agent, or Firm* — Maschoff Brennan

(57) ABSTRACT

An optical isolation structure and a method for fabricating the same are provided. The optical isolation structure includes a first dielectric layer, a second dielectric layer, a third dielectric layer and a dielectric post. The first dielectric layer includes a trench portion located in a trench of the semiconductor substrate. The second dielectric layer includes a trench portion covering the trench portion of the first dielectric layer and located in the trench of the semiconductor substrate. The third dielectric layer includes a trench portion covering the trench portion of the second dielectric layer and located in the trench of the semiconductor substrate. The dielectric post is disposed in the trench of the semiconductor substrate and covering the trench portion of the third dielectric layer.

20 Claims, 15 Drawing Sheets

ISOLATION STRUCTURE AND IMAGE SENSOR

RELATED APPLICATIONS

This application is a continuation of the U.S. application Ser. No. 15/458,131, filed on Mar. 14, 2017, now U.S. patent Ser. No. 10/157,949, issued on Dec. 18, 2018. All disclosures are incorporated herewith by reference.

BACKGROUND

In semiconductor technology, image sensors are used for sensing light emitted towards them to form an image. For converting various photo energy of the light into electrical signals, the image sensor includes pixels having photosensitive diodes, reset transistors, source follower transistors, pinned layer photodiodes, and/or transfer transistors. In general, the image sensor may be a complementary metal-oxide-semiconductor (CMOS) image sensor (CIS), an active-pixel sensor (APS), a passive-pixel sensor and a charged-coupled device (CCD) sensor. The above image sensor is widely used in various applications such as digital camera or mobile phone camera devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
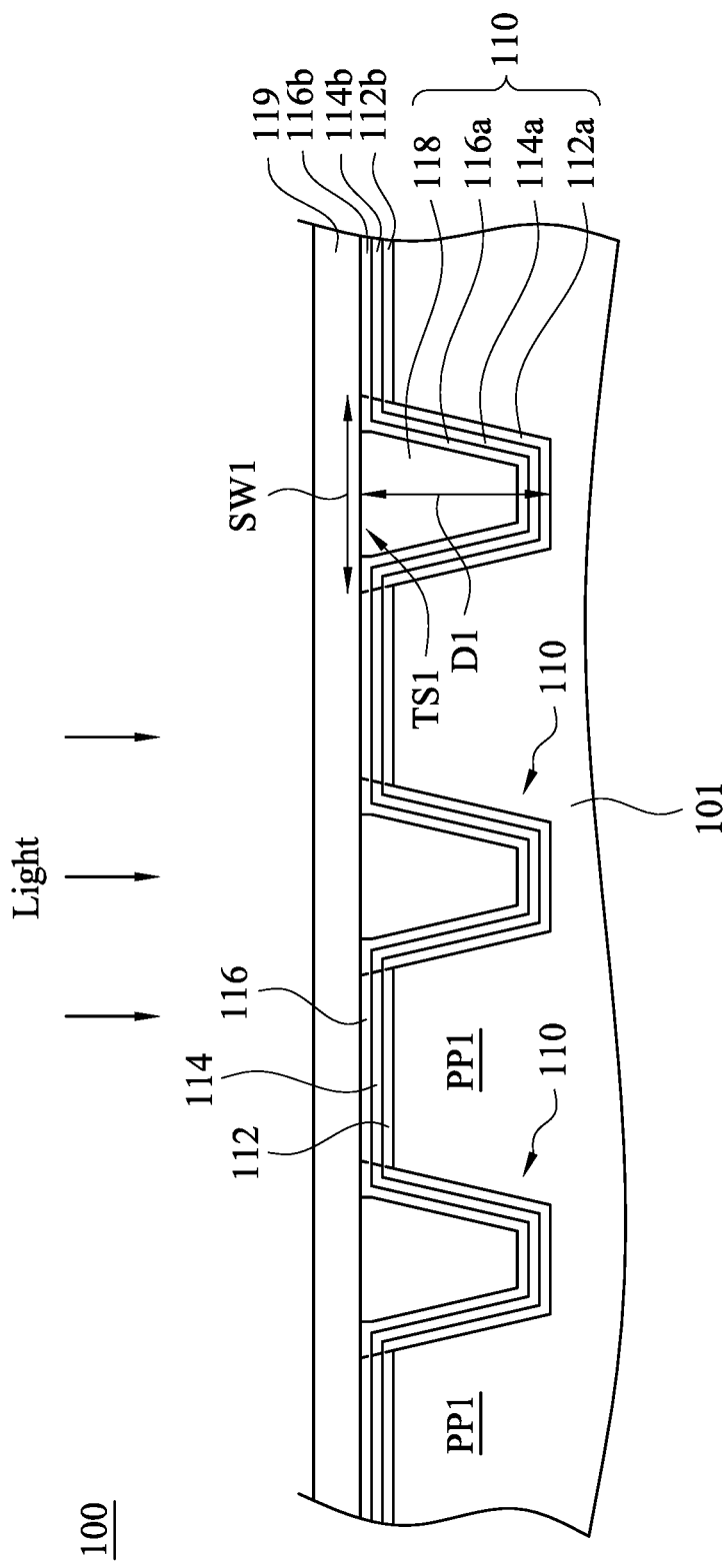
FIG. 1 is a schematic cross-sectional view of an isolation structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to an isolation structure used in an image sensor to reduce crosstalk between pixels of the image sensor. The isolation structure includes a first dielectric layer, a second dielectric layer, a third dielectric layer and a dielectric post. The first dielectric layer, the second dielectric layer and the third dielectric layer have trench portions located in a trench of the semiconductor substrate, and the dielectric post is located on the trench portions. Because the isolation structure includes the three dielectric layers and the dielectric post located on the three dielectric layers, the isolation structure can be formed to have a greater depth, thereby providing better isolation performance.

Referring to FIG. 1, FIG. 1 is a schematic cross-sectional view of an optical isolation structure 100 in accordance with some embodiments of the present disclosure. The optical isolation structure 100 includes a trench isolation structure 110 formed in a grid pattern. In some embodiments, the optical isolation structure 100 further includes a dielectric layer 119 disposed on the trench isolation structure 110. The trench isolation structure 110 is disposed in a semiconductor substrate 101. The semiconductor substrate 101 includes a trench formed in a grid pattern and plural protrusions PP1 separated by the trench.

In some embodiments, the semiconductor substrate 101 may be a semiconductor material and may include structures including a graded layer or a buried oxide, for example. In some exemplary examples, the semiconductor substrate 101 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 101. Alternatively, the semiconductor substrate 101 may be an active layer of a semiconductor-on-insulator (SOI) substrate or a multi-layered structure such as a silicon-germanium layer formed on a bulk silicon layer.

A first dielectric layer 112 is disposed on the semiconductor substrate 101. The first dielectric layer 112 includes a trench portion 112a and plural flat portions 112b. The trench portion 112a is located in the trench of the semiconductor substrate 101 to cover the trench of the semiconductor substrate 101, and the flat portions 112b are disposed on the protrusions PP1 of the semiconductor substrate 101. In some embodiments, because the trench of the semiconductor substrate 101 is formed in a grid pattern, the trench portion 112a is formed in the grid pattern. In some embodiments, the first dielectric layer 112 is formed from high-k material. The high-k material includes ZrO, AlO, TiO, HfO or TaO, but embodiments of the present disclosure are not limited thereto.

A second dielectric layer 114 is disposed on the first dielectric layer 112 and covers the first dielectric layer 112. The second dielectric layer 114 includes a trench portion 114a and plural flat portions 114b. The trench portion 114a is located in the trench of the semiconductor substrate 101 and covers the trench portion 112a of the first dielectric layer 112. The flat portions 114b cover the flat portions 112b of the first dielectric layer 112. In some embodiments, because the trench of the semiconductor substrate 101 is formed in a grid pattern, the trench portion 114a is formed in the grid pattern. In some embodiments, the second dielectric layer 114 is formed from high-k material, and a dielectric constant of the first dielectric layer 112 is smaller than that of the second dielectric layer 114. The high-k material includes ZrO, AlO, TiO, HfO or TaO, but embodiments of the present disclosure are not limited thereto. Further, in some embodiments, a band gap value of the first dielectric layer 112 is greater than a band gap value of the second dielectric layer 114.

A third dielectric layer 116 is disposed on the second dielectric layer 114 and covers the second dielectric layer 114. The second dielectric layer 116 includes a trench portion 116a and plural flat portions 116b. The trench portion 116a is located in the trench of the semiconductor substrate 101 and covers the trench portion 114a of the second dielectric layer 114. The flat portions 116b cover the flat portions 114b of the second dielectric layer 114. In some embodiments, because the trench of the semiconductor substrate 101 is formed in a grid pattern, the trench portion 116a is formed in the grid pattern. In some embodiments, the third dielectric layer 116 is formed from high-k material, and the dielectric constant of the second dielectric layer 114 is smaller than that of the third dielectric layer 116. The high-k material includes ZrO, AlO, TiO, HfO or TaO, but embodiments of the present disclosure are not limited thereto. Further, in some embodiments, the band gap value of the second dielectric layer 114 is greater than a band gap value of the third dielectric layer 116.

A dielectric post 118 is disposed in the trench of the semiconductor substrate 101 and covers the trench portion 116a of the third dielectric layer 116, thereby forming the trench isolation structure 110. Because the trench of the semiconductor substrate 101 is formed in a grid pattern, the dielectric post 118 is formed in the grid pattern. In some embodiments, the dielectric post 118 is formed from silicon oxide, silicon nitride, silicon oxynitride or silicon carbide. However, embodiments of the present disclosure are not limited thereto. Further, in some embodiments, the dielectric layer 119 is disposed on the trench isolation structure 110 and covers the trench isolation structure 110 and the flat portions 116b of the third dielectric layer 116.

The trench isolation structure 110 includes the trench portion 114a of the first dielectric layer 112, the trench portion 114a of the second dielectric layer 114, the trench portion 116a of the third dielectric layer 116 and the dielectric post 118. Because the trench of the semiconductor substrate 101 is formed in a grid pattern, the trench isolation structure 110 is also formed in the grid pattern. As shown in FIG. 1, a cross-sectional view of the trench isolation structure 110 has a structure depth D1 and a top surface TS1. The top surface TS1 includes a portion of the dielectric post 118 and plural portions of the third dielectric layer 116. In some embodiments, a ratio of the structure depth D1 to a surface width SW1 of the top surface TS1 is designed to be equal to or greater than about 5, thereby enabling the trench isolation structure 110 to provide better isolation performance. In some embodiments, the ratio of the structure depth D1 to the surface width SW1 ranges from about 5 to about 15. However, embodiments of the present disclosure are not limited thereto.

Because the trench isolation structure 110 includes the dielectric post 118 and the trench portions 112a, 114a and 116a, the trench isolation structure 110 can be formed to have a greater depth, thereby providing better isolation performance for lower crosstalk and corresponding noise.

Figure 2A:
FIG. 2A to FIG. 2F are cross-sectional views of intermediate stages showing a method for fabricating an isolation structure in accordance with some embodiments of the present disclosure.

Referring to FIG. 2A to FIG. 2F, FIG. 2A to FIG. 2F are cross-sectional views of intermediate stages showing a method for fabricating an optical isolation structure in accordance with some embodiments of the present disclosure. As shown in FIG. 2A, a semiconductor substrate 201 is provided at first. In some embodiments, the semiconductor substrate 201 may be a semiconductor material and may include structures including a graded layer or a buried oxide, for example. In some exemplary examples, the semiconductor substrate 201 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 201. Alternatively, the semiconductor substrate 201 may be an active layer of a semiconductor-on-insulator (SOI) substrate or a multi-layered structure such as a silicon-germanium layer formed on a bulk silicon layer.

Figure 2B:
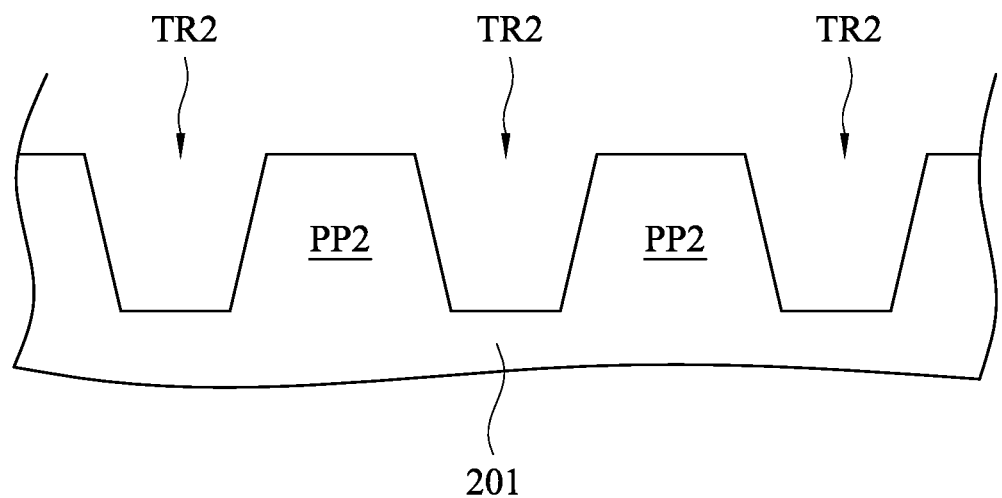

Then, a trench TR2 is formed in the semiconductor substrate 201 as shown in FIG. 2B. The trench TR2 is formed in a grid pattern, thus plural protrusions PP2 of the semiconductor substrate 201 are separated by the trench TR2. In some embodiments, the trench TR2 can be formed by a wet etching process or a dry etching process. However, embodiments of the present disclosure are not limited thereto.

Figure 2C:
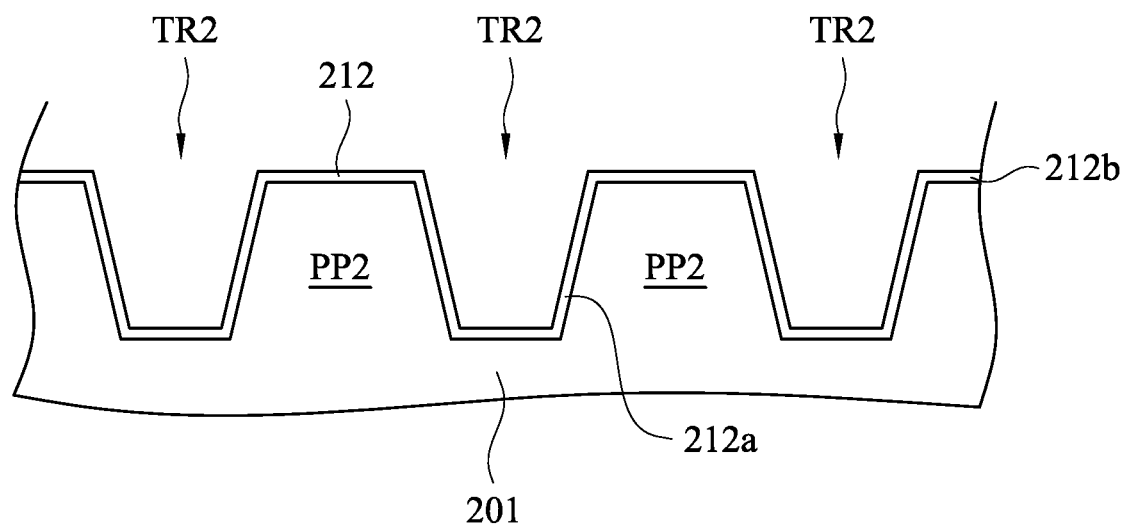

Thereafter, a first dielectric layer 212 is formed to cover the semiconductor substrate 201, as shown in FIG. 2C. The first dielectric layer 212 includes a trench portion 212a and flat portions 212b. The trench portion 212a is located in the trench TR2 of the semiconductor substrate 201 to cover the trench TR2 of the semiconductor substrate 201, and the flat portions 212b are disposed on the protrusions PP2 of the semiconductor substrate 201. In some embodiments, because the trench TR2 of the semiconductor substrate 201 is formed in a grid pattern, the trench portion 212a is also formed in the grid pattern. In some embodiments, the first dielectric layer 212 is formed from high-k material. The high-k material includes ZrO, AlO, TiO, HfO or TaO, but embodiments of the present disclosure are not limited thereto. In some embodiments, the first dielectric layer 212 can be formed by using a deposition process such as an atomic layer deposition (ALD). Other methods to form the first dielectric layer 212 include chemical vapor deposition (CVD), physical vapor deposition (PVD), and plasma enhanced chemical vapor deposition (PECVD).

Figure 2D:
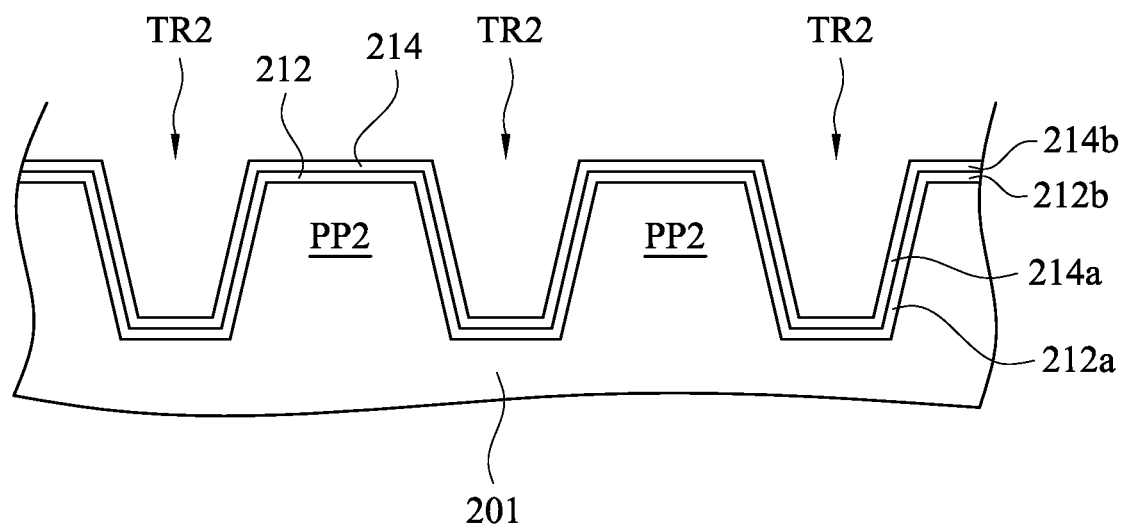

Then, a second dielectric layer 214 is formed to cover the first dielectric layer 212, as shown in FIG. 2D. The second dielectric layer 214 includes a trench portion 214a and flat portions 214b. The trench portion 214a is located in the trench TR2 of the semiconductor substrate 201 and covers the trench portion 212a of the first dielectric layer 212. The flat portions 214b cover the flat portions 212b of the first dielectric layer 212. In some embodiments, because the trench TR2 of the semiconductor substrate 201 is formed in a grid pattern, the trench portion 214a is also formed in the grid pattern. In some embodiments, the second dielectric layer 214 is formed from high-k material, and a dielectric constant of the first dielectric layer 212 is smaller than that of the second dielectric layer 214. The high-k material includes ZrO, AlO, TiO, HfO or TaO, but embodiments of the present disclosure are not limited thereto. In some embodiments, the second dielectric layer 214 can be formed by using a deposition process such as an atomic layer deposition (ALD). Other methods to form the second dielectric layer 214 include chemical vapor deposition (CVD), physical vapor deposition (PVD), and plasma enhanced chemical vapor deposition (PECVD).

Figure 2E:
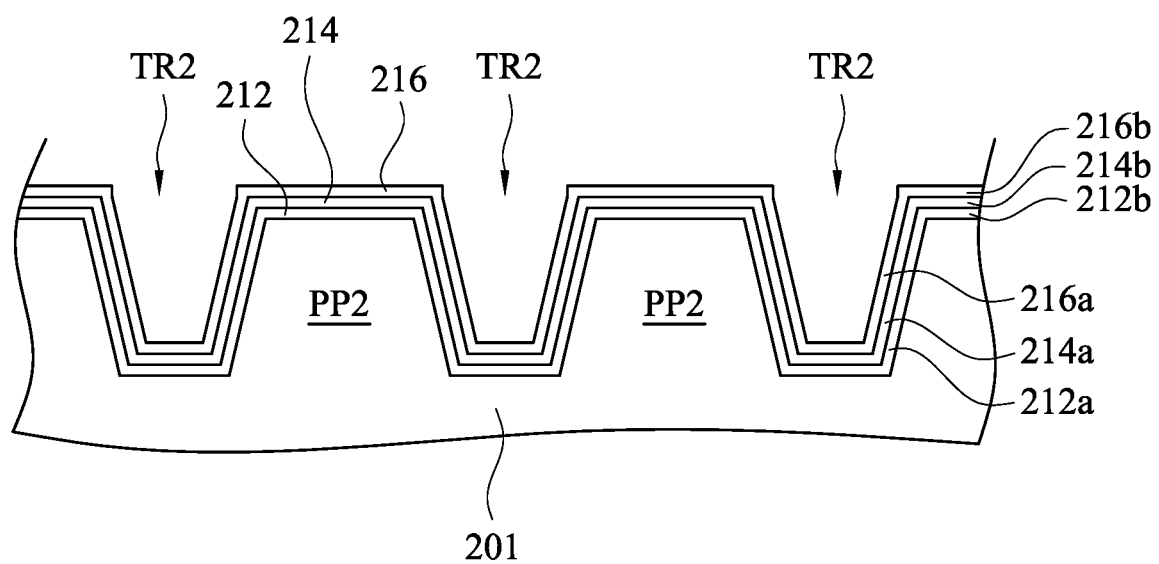

Thereafter, a third dielectric layer 216 is formed to cover the second dielectric layer 214, as shown in FIG. 2E. The third dielectric layer 216 includes a trench portion 216a and plural flat portions 216b. The trench portion 216a is located in the trench of the semiconductor substrate 201 and covers the trench portion 214a of the second dielectric layer 214. The flat portions 216b cover the flat portions 214b of the second dielectric layer 214. In some embodiments, because the trench TR2 of the semiconductor substrate 201 is formed in a grid pattern, the trench portion 216a is also formed in the grid pattern. In some embodiments, the third dielectric layer 216 is formed from high-k material, and the dielectric constant of the second dielectric layer 214 is smaller than that of the third dielectric layer 216. The high-k material includes ZrO, AlO, TiO, HfO or TaO, but embodiments of the present disclosure are not limited thereto. In some embodiments, the third dielectric layer 216 can be formed by using a deposition process such as an atomic layer deposition (ALD). Other methods to form the third dielectric layer 216 include chemical vapor deposition (CVD), physical vapor deposition (PVD), and plasma enhanced chemical vapor deposition (PECVD).

Further, in some embodiments, a band gap value of the first dielectric layer 212 is greater than a band gap value of the second dielectric layer 214, and a band gap value of the second dielectric layer 214 is greater than a band gap value of the third dielectric layer 216. In some embodiments, a flat band voltage of the first dielectric layer 212 is greater than a flat band voltage of the second dielectric layer 214, and a normalized areal oxygen density $\sigma/\sigma_{SiO2}$ of the first dielectric layer 212 is greater than a normalized areal oxygen density $\sigma/\sigma_{SiO2}$ of the second dielectric layer 214. Therefore, the method for fabricating the optical isolation structure is benefited.

Figure 2F:
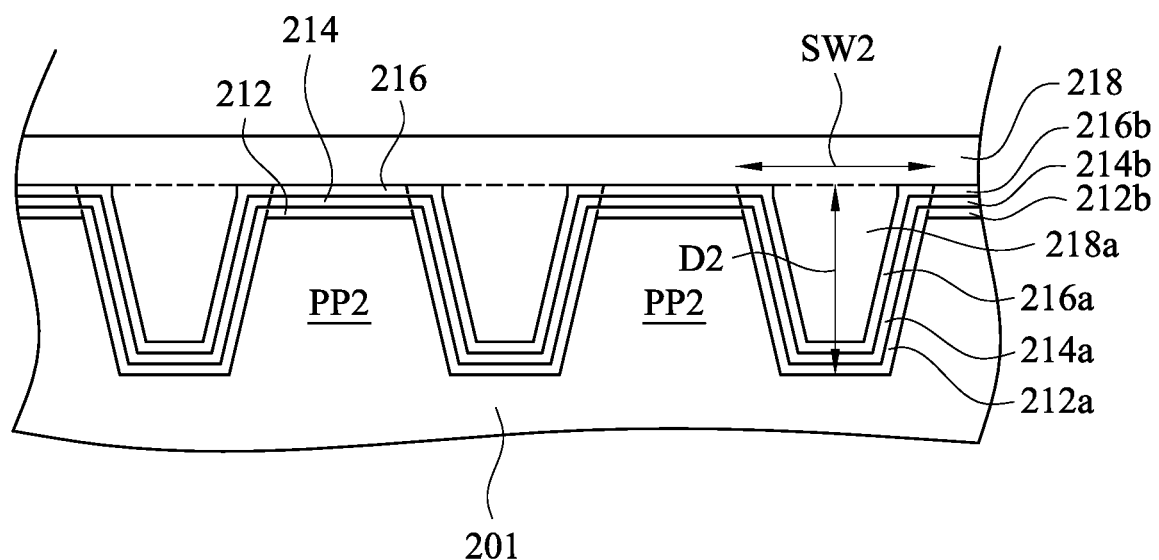

Then, a fourth dielectric layer 218 is formed on the semiconductor substrate 201 to cover the trench TR2, as shown in FIG. 2F. The fourth dielectric layer 218 covers the trench portion 216a of the third dielectric layer 216 to fill the trench TR2 with a portion of the fourth dielectric layer 218, thereby forming a dielectric post 218a in the trench TR2. Because the trench TR2 of the semiconductor substrate 201 is formed in a grid pattern, the dielectric post 218a is also formed in the grid pattern. In some embodiments, the fourth dielectric layer 218 is formed from silicon oxide, silicon nitride, silicon oxynitride or silicon carbide, but embodiments of the present disclosure are not limited thereto. In some embodiments, the fourth dielectric layer 218 can be formed by using a deposition process such as an atomic layer deposition (ALD). Other methods to form the fourth dielectric layer 218 include chemical vapor deposition (CVD), physical vapor deposition (PVD), and plasma enhanced chemical vapor deposition (PECVD).

As shown in FIG. 2F, a cross-sectional view of the trench isolation structure 210 is formed to have a structure depth D2 and a top surface TS2. The top surface TS2 includes a portion of the dielectric post 218 and plural portions of the third dielectric layer 216. In some embodiments, a ratio of the structure depth D2 to a surface width SW2 of the top surface TS2 is designed to be equal to or greater than about 5, thereby enabling the trench isolation structure 210 to provide better isolation performance. In some embodiments, the ratio of the structure depth D2 to the surface width SW2 ranges from about 5 to about 15. However, embodiments of the present disclosure are not limited thereto.

Figure 3:
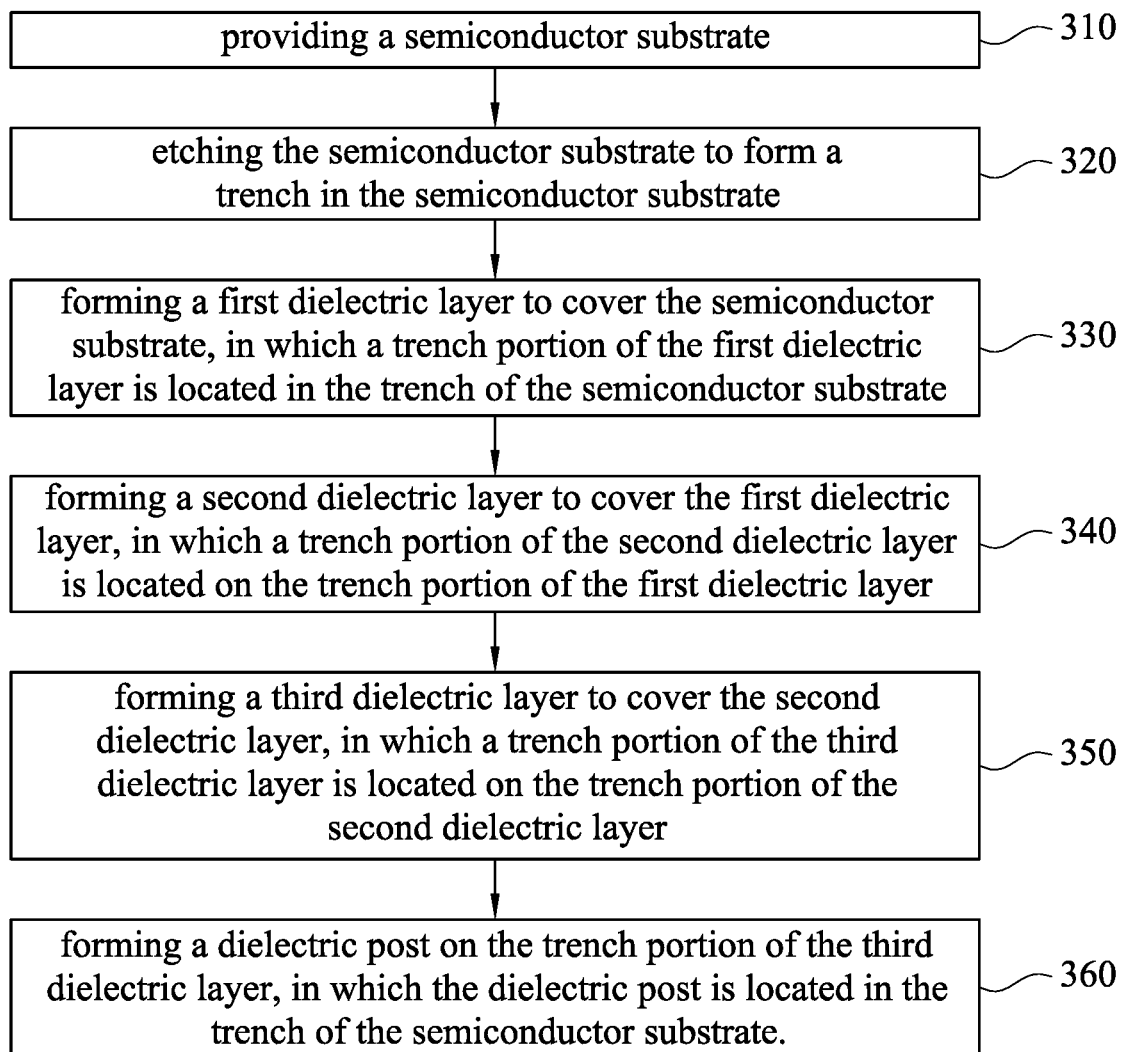
FIG. 3 is a flow chart showing a method for fabricating an isolation structure in accordance with embodiments of the present disclosure.

Referring to FIG. 3, FIG. 3 is a flow chart showing a method 300 for fabricating an optical isolation structure in accordance with embodiments of the present disclosure. The method 300 begins at operation 310. Operation 310 is performed to provide the semiconductor substrate 201 as shown in FIG. 2A.

Then, operation 320 is performed to etch the form the semiconductor substrate 201 to form the trench TR2 in the semiconductor substrate 201 as shown in FIG. 2B.

Thereafter, operation 330 is performed to form the first dielectric layer 212 to cover the semiconductor substrate 201 as shown in FIG. 2C, in which the first dielectric layer 212a includes the trench portion 212a located in the trench TR2 of the semiconductor substrate 201.

Then, operation 340 is performed to form the second dielectric layer 214 to cover the first dielectric layer 212 as shown in FIG. 2D, in which the second dielectric layer 214 includes the trench portion 214a covering the trench portion 212a of the first dielectric layer 212 and located in the trench TR2 of the semiconductor substrate 201.

Thereafter, operation 350 is performed to form the third dielectric layer 216 to cover the second dielectric layer 214 as shown in FIG. 2E, in which the third dielectric layer 216 includes the trench portion 216a covering the trench portion 214a of the second dielectric layer 214 and located in the trench TR2 of the semiconductor substrate 201.

Then, operation 360 is performed to form the dielectric post 218a in the trench TR2 of the semiconductor substrate 201 to cover the trench portion 216a of the third dielectric layer 216 as shown in FIG. 2F.

Figure 4A:
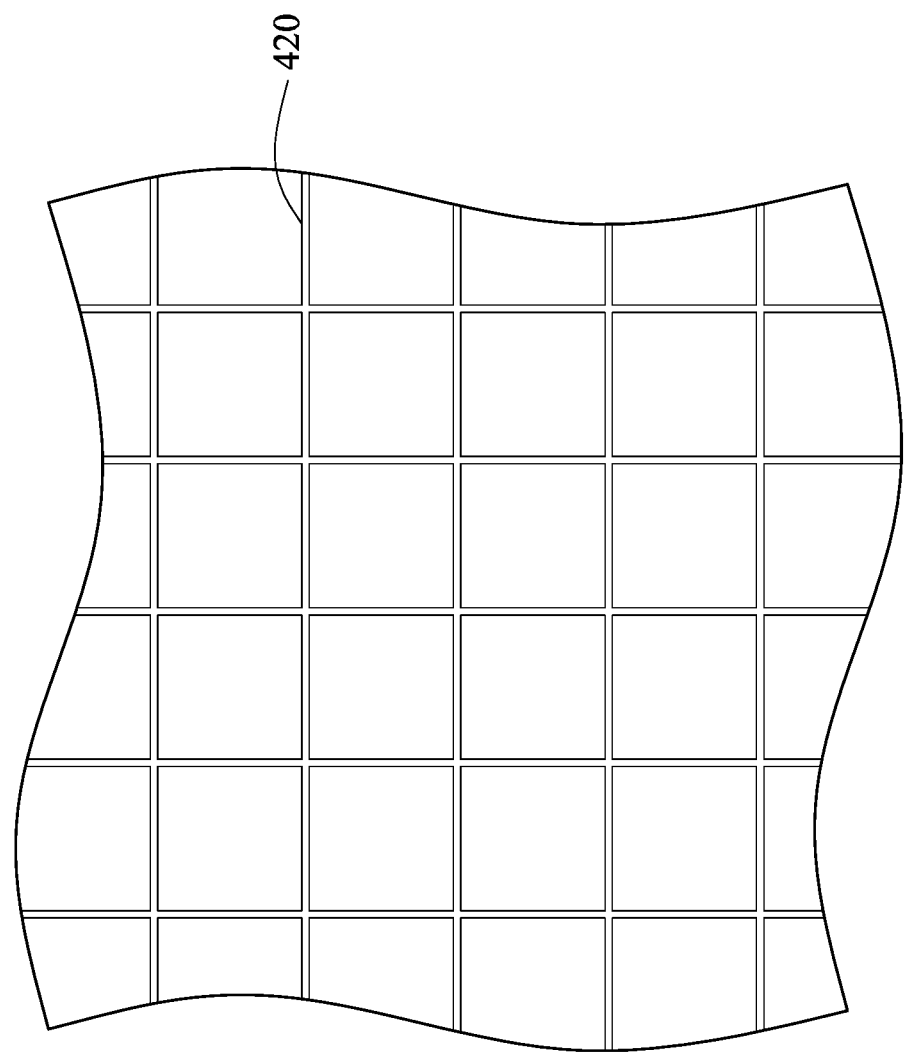
FIG. 4A is a schematic top view of an isolation structure in accordance with some embodiments of the present disclosure.
Figure 4B:
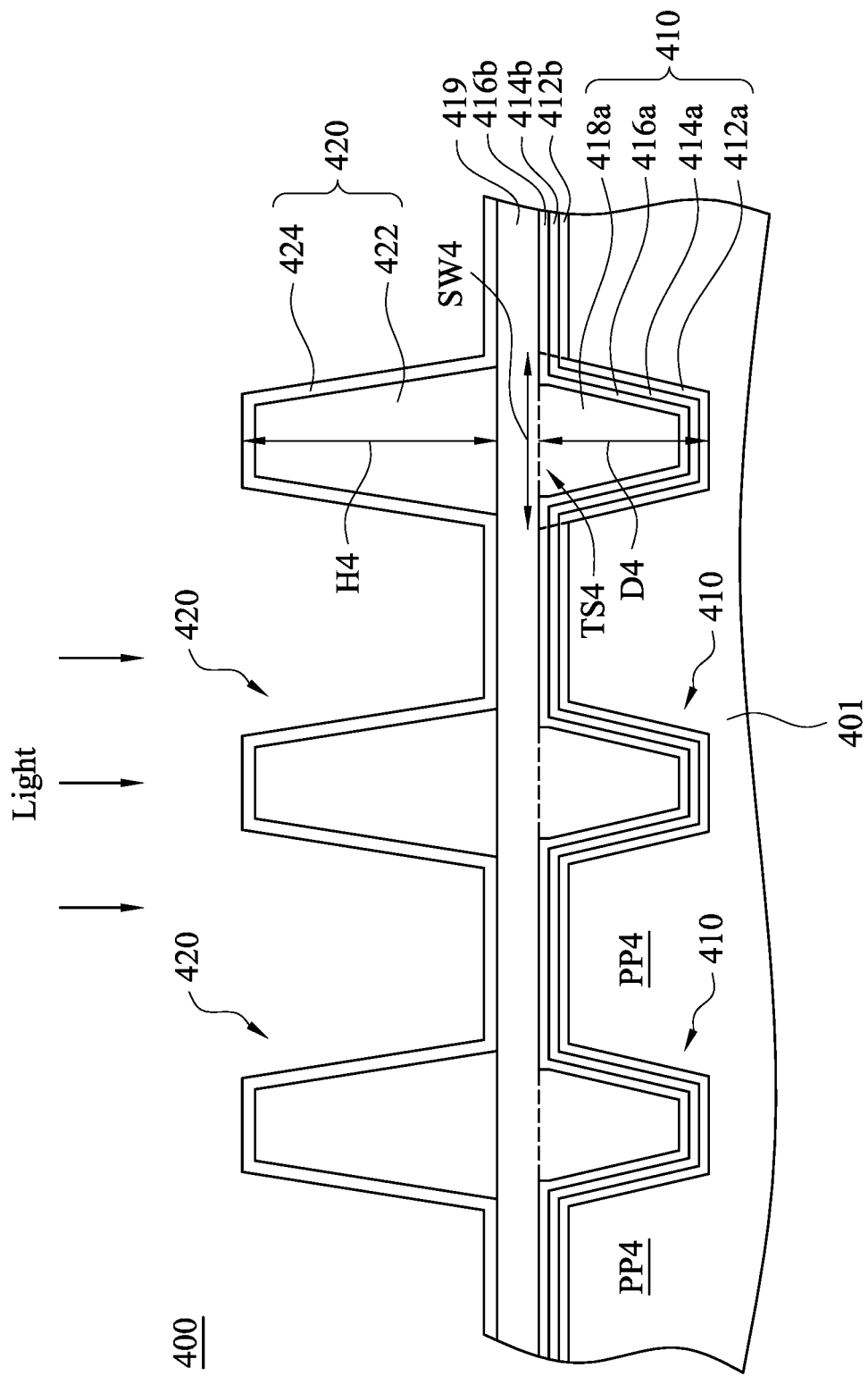
FIG. 4B is a schematic cross-sectional view of the isolation structure in accordance with some embodiments of the present disclosure.

Referring to FIG. 4A and FIG. 4B, FIG. 4A is a schematic top view of an optical isolation structure 400 in accordance with some embodiments of the present disclosure, and FIG. 4B is a schematic cross-sectional view of the optical isolation structure 400 in accordance with some embodiments of the present disclosure. The optical isolation structure 400 includes a trench isolation structure 410 and a grid isolation structure 420, in which the trench isolation structure 410 and the grid isolation structure 420 are formed in a grid pattern. In some embodiments, the optical isolation structure 400 further includes a dielectric layer 419 disposed between the trench isolation structure 410 and the grid isolation structure 420.

The trench isolation structure 410 is disposed in a semiconductor substrate 401. The semiconductor substrate 401 includes a trench formed in the grid pattern and plural protrusions PP4 separated by the trench. In some embodiments, the semiconductor substrate 401 may be a semiconductor material and may include structures including a graded layer or a buried oxide, for example. In some exemplary examples, the semiconductor substrate 401 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 401. Alternatively, the semiconductor substrate 401 may be an active layer of a semiconductor-on-insulator (SOI) substrate or a multi-layered structure such as a silicon-germanium layer formed on a bulk silicon layer.

A first dielectric layer 412 is disposed on the semiconductor substrate 401. The first dielectric layer 412 includes a trench portion 412a and plural flat portions 412b. The trench portion 412a is located in the trench of the semiconductor substrate 401 to cover the trench of the semiconductor substrate 401, and the flat portions 412b are disposed on the protrusions PP4 of the semiconductor substrate 401. In some embodiments, because the trench of the semiconductor substrate 401 is formed in a grid pattern, the trench portion 412a is also formed in the grid pattern. In some embodiments, the first dielectric layer 412 is formed from high-k material. The high-k material includes ZrO, AlO, TiO, HfO or TaO, but embodiments of the present disclosure are not limited thereto.

A second dielectric layer 414 is disposed on the first dielectric layer 412 and covers the first dielectric layer 412. The second dielectric layer 414 includes a trench portion 414a and plural flat portions 414b. The trench portion 414a is located in the trench of the semiconductor substrate 401 and covers the trench portion 412a of the first dielectric layer 412. The flat portions 414b cover the flat portions 412b of the first dielectric layer 412. In some embodiments, because the trench of the semiconductor substrate 401 is formed in a grid pattern, the trench portion 414a is also formed in the grid pattern. In some embodiments, the second dielectric layer 414 is formed from high-k material, and a dielectric constant of the first dielectric layer 112 is smaller than that of the second dielectric layer 414. The high-k material includes ZrO, AlO, TiO, HfO or TaO, but embodiments of the present disclosure are not limited thereto. Further, in some embodiments, a band gap value of the first dielectric layer 412 is greater than a band gap value of the second dielectric layer 414.

A third dielectric layer 416 is disposed on the second dielectric layer 414 and covers the second dielectric layer 414. The second dielectric layer 416 includes a trench portion 416a and plural flat portions 416b. The trench portion 416a is located in the trench of the semiconductor substrate 401 and covers the trench portion 414a of the second dielectric layer 414. The flat portions 116b cover the flat portions 414b of the second dielectric layer 414. In some embodiments, because the trench of the semiconductor substrate 401 is formed in a grid pattern, the trench portion 416a is also formed in the grid pattern. In some embodiments, the third dielectric layer 416 is formed from high-k material, and the dielectric constant of the second dielectric layer 414 is smaller than that of the third dielectric layer 416. The high-k material includes ZrO, AlO, TiO, HfO or TaO, but embodiments of the present disclosure are not limited thereto. Further, in some embodiments, the band gap value of the second dielectric layer 414 is greater than a band gap value of the third dielectric layer 416.

A dielectric post 418 is disposed in the trench of the semiconductor substrate 401 and covers the trench portion 416a of the third dielectric layer 416, thereby forming the trench isolation structure 410. Because the trench of the semiconductor substrate 401 is formed in a grid pattern, the dielectric post 418 is also formed in the grid pattern. In some embodiments, the dielectric post 418 is formed from silicon oxide, silicon nitride, silicon oxynitride or silicon carbide. However, embodiments of the present disclosure are not limited thereto. In some embodiments, the dielectric layer 419 is disposed on the trench isolation structure 410 and covers the trench isolation structure 410 and the flat portions 416b of the third dielectric layer 416.

The trench isolation structure 410 includes the trench portion 414a of the first dielectric layer 412, the trench portion 414a of the second dielectric layer 414, the trench portion 416a of the third dielectric layer 416 and the dielectric post 418. Because the trench of the semiconductor substrate 401 is formed in a grid pattern, the trench isolation structure 410 is also formed in the grid pattern. As shown in FIG. 4B, a cross-sectional view of the trench isolation structure 410 has a structure depth D4 and a top surface TS4. The top surface TS4 includes a portion of the dielectric post 418 and plural portions of the third dielectric layer 416. In some embodiments, a ratio of the structure depth D4 to a surface width SW4 of the top surface TS4 is designed to be equal to or greater than about 5, thereby enabling the trench isolation structure 410 to provide better isolation performance. In some embodiments, the ratio of the structure depth D4 to the surface width TS4 ranges from about 5 to about 15. However, embodiments of the present disclosure are not limited thereto.

A reflective layer 422 is disposed on the dielectric layer 419. The reflective layer 422 is formed in the grid pattern and disposed corresponding to the dielectric post 418. The reflective layer 422 is formed by a reflective material capable of reflecting light emitted to the reflective layer 422. In some embodiments, the reflective material includes metal, such as aluminum, tungsten, copper, tantalum, titanium, alloys thereof, or combinations thereof.

A passivation layer 424 is disposed on the reflective layer 422 and the dielectric layer 419. A portion of the passivation layer 424 covers the reflective layer 422, thereby forming the grid isolation structure 420. In some embodiments, the grid isolation structure 420 has a structure height H4, and a ratio of the structure depth D4 to the structure height H4 is equal to or greater than about 4, thereby providing better isolation performance for lower crosstalk and corresponding noise. In some embodiments, the ratio of the structure depth D4 to the structure height H4 ranges about 4 to about 9.

Because the trench isolation structure 410 includes the dielectric post 418 and the trench portions 412a, 414a and 416a, the trench isolation structure 410 can be formed to have a greater depth to provide better isolation performance for lower crosstalk and corresponding noise.

Figure 5A:
FIG. 5A to FIG. 5I are cross-sectional views of intermediate stages showing a method for fabricating an isolation structure in accordance with some embodiments of the present disclosure.

Referring to FIG. 5A to FIG. 5I, FIG. 5A to FIG. 5I are cross-sectional views of intermediate stages showing a method for fabricating an optical isolation structure in accordance with some embodiments of the present disclosure. As shown in FIG. 5A, a semiconductor substrate 501 is provided at first. In some embodiments, the semiconductor substrate 501 may be a semiconductor material and may include structures including a graded layer or a buried oxide, for example. In some exemplary examples, the semiconductor substrate 501 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 501. Alternatively, the semiconductor substrate 501 may be an active layer of a semiconductor-on-insulator (SOI) substrate or a multi-layered structure such as a silicon-germanium layer formed on a bulk silicon layer.

Figure 5B:
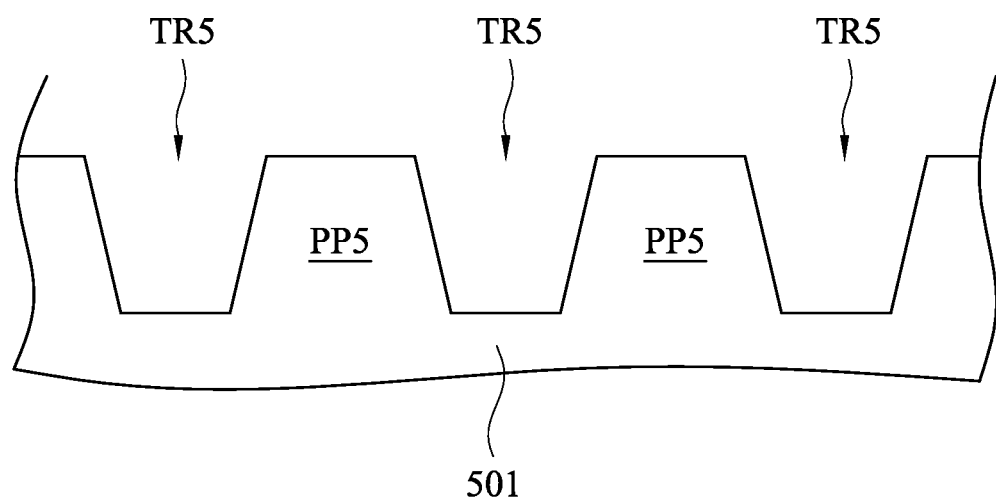

Then, a trench TR5 is formed in the semiconductor substrate 501 as shown in FIG. 5B. The trench TR5 is formed in a grid pattern, thus plural protrusions PP5 of the semiconductor substrate 501 are separated by the trench TR5. In some embodiments, the trench TR5 can be formed by a wet etching process or a dry etching process. However, embodiments of the present disclosure are not limited thereto.

Figure 5C:
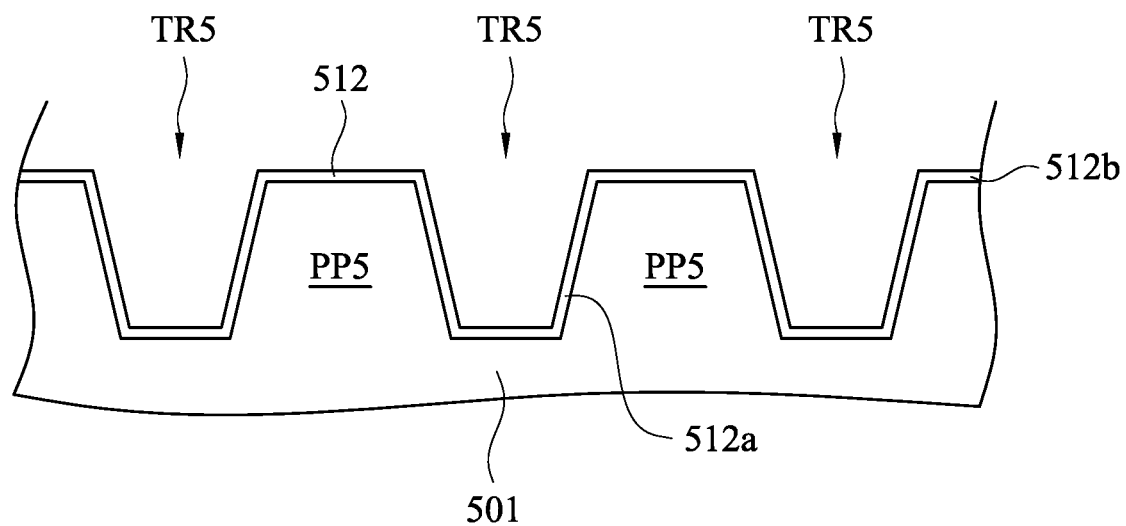

Thereafter, a first dielectric layer 512 is formed to cover the semiconductor substrate 501, as shown in FIG. 5C. The first dielectric layer 512 includes a trench TR5 portion 512a and flat portions 512b. The trench portion 512a is located in the trench TR5 of the semiconductor substrate 501 to cover the trench TR5 of the semiconductor substrate 501, and the flat portions 512b are disposed on the protrusions PP5 of the semiconductor substrate 501. In some embodiments, because the trench TR5 of the semiconductor substrate 501 is formed in a grid pattern, the trench portion 512a is also formed in the grid pattern. In some embodiments, the first dielectric layer 512 is formed from high-k material. The high-k material includes ZrO, AlO, TiO, HfO or TaO, but embodiments of the present disclosure are not limited thereto. In some embodiments, the first dielectric layer 512 can be formed by using a deposition process such as an atomic layer deposition (ALD). Other methods to form the first dielectric layer 512 include chemical vapor deposition (CVD), physical vapor deposition (PVD), and plasma enhanced chemical vapor deposition (PECVD).

Figure 5D:
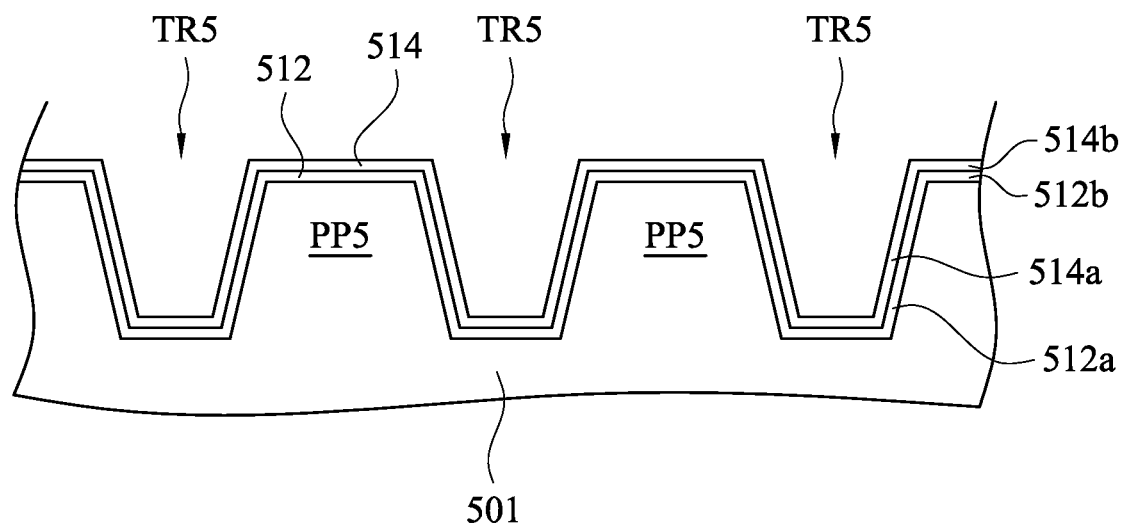

Then, a second dielectric layer 514 is formed to cover the first dielectric layer 512, as shown in FIG. 5D. The second dielectric layer 514 includes a trench portion 514a and flat portions 514b. The trench portion 514a is located in the trench TR5 of the semiconductor substrate 501 and covers the trench portion 512a of the first dielectric layer 512. The flat portions 214b cover the flat portions 512b of the first dielectric layer 512. In some embodiments, because the trench TR5 of the semiconductor substrate 501 is formed in a grid pattern, the trench portion 514a is also formed in the grid pattern. In some embodiments, the second dielectric layer 514 is formed from high-k material, and a dielectric constant of the first dielectric layer 512 is smaller than that of the second dielectric layer 514. The high-k material includes ZrO, AlO, TiO, HfO or TaO, but embodiments of the present disclosure are not limited thereto. In some embodiments, the second dielectric layer 514 can be formed by using a deposition process such as an atomic layer deposition (ALD). Other methods to form the second dielectric layer 514 include chemical vapor deposition (CVD), physical vapor deposition (PVD), and plasma enhanced chemical vapor deposition (PECVD).

Figure 5E:
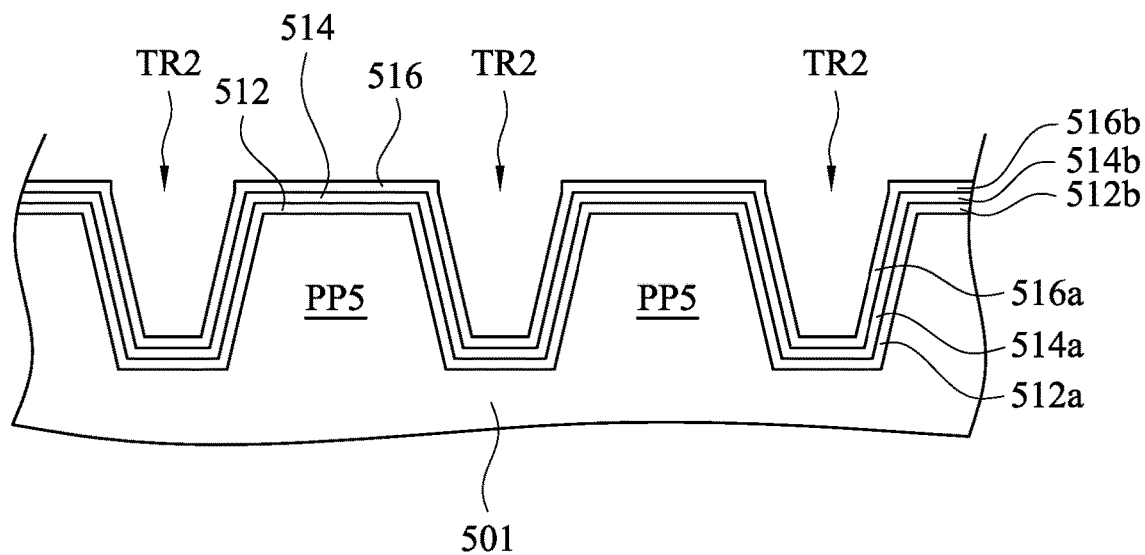

Thereafter, a third dielectric layer 516 is formed to cover the second dielectric layer 514, as shown in FIG. 5E. The third dielectric layer 516 includes a trench portion 516a and plural flat portions 516b. The trench portion 516a is located in the trench of the semiconductor substrate 501 and covers the trench portion 514a of the second dielectric layer 514. The flat portions 516b cover the flat portions 514b of the second dielectric layer 514. In some embodiments, because the trench TR5 of the semiconductor substrate 501 is formed in a grid pattern, the trench portion 516a is also formed in the grid pattern. In some embodiments, the third dielectric layer 516 is formed from high-k material, and the dielectric constant of the second dielectric layer 514 is smaller than that of the third dielectric layer 516. The high-k material includes ZrO, AlO, TiO, HfO or TaO, but embodiments of the present disclosure are not limited thereto. In some embodiments, the third dielectric layer 516 can be formed by using a deposition process such as an atomic layer deposition (ALD). Other methods to form the third dielectric layer 516 include chemical vapor deposition (CVD), physical vapor deposition (PVD), and plasma enhanced chemical vapor deposition (PECVD).

Further, in some embodiments, a band gap value of the first dielectric layer 512 is greater than a band gap value of the second dielectric layer 514, and a band gap value of the second dielectric layer 514 is greater than a band gap value of the third dielectric layer 516. In some embodiments, a flat band voltage of the first dielectric layer 512 is greater than a flat band voltage of the second dielectric layer 514, and a normalized areal oxygen density $\sigma/\sigma_{SiO2}$ of the first dielectric layer 512 is greater than a normalized areal oxygen density $\sigma/\sigma_{SiO2}$ of the second dielectric layer 514. Therefore, the method for fabricating the optical isolation structure is benefited.

Figure 5F:
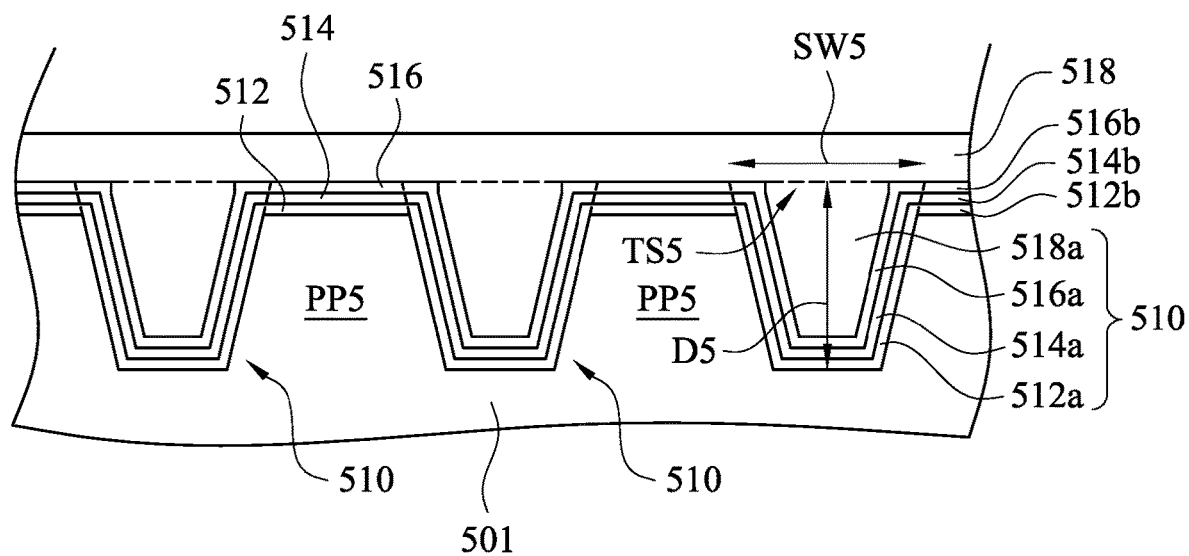

Then, a fourth dielectric layer 518 is formed on the semiconductor substrate 501 to cover the trench TR5, as shown in FIG. 5F. The fourth dielectric layer 518 covers the trench portion 516a of the third dielectric layer 516 to fill the trench TR5 with a portion of the fourth dielectric layer 518, thereby forming a dielectric post 518a in the trench TR5. Because the trench TR5 of the semiconductor substrate 501 is formed in a grid pattern, the dielectric post 518a is also formed in the grid pattern. In some embodiments, the fourth dielectric layer 518 is formed from silicon oxide, silicon nitride, silicon oxynitride or silicon carbide, but embodiments of the present disclosure are not limited thereto. In some embodiments, the fourth dielectric layer 518 can be formed by using a deposition process such as an atomic layer deposition (ALD). Other methods to form the fourth dielectric layer 518 include chemical vapor deposition (CVD), physical vapor deposition (PVD), and plasma enhanced chemical vapor deposition (PECVD).

As shown in FIG. 5F, a cross-sectional view of the trench isolation structure 510 is formed to have a structure depth D5 and a top surface TS5. The top surface TS5 includes a portion of the dielectric post 518 and plural portions of the third dielectric layer 516. In some embodiments, a ratio of the structure depth D5 to a surface width SW5 of the top surface TS5 is designed to be equal to or greater than about 5, thereby enabling the trench isolation structure 510 to provide better isolation performance. In some embodiments, the ratio of the structure depth D5 to the surface width SW5 ranges from about 5 to about 15. However, embodiments of the present disclosure are not limited thereto.

Figure 5G:
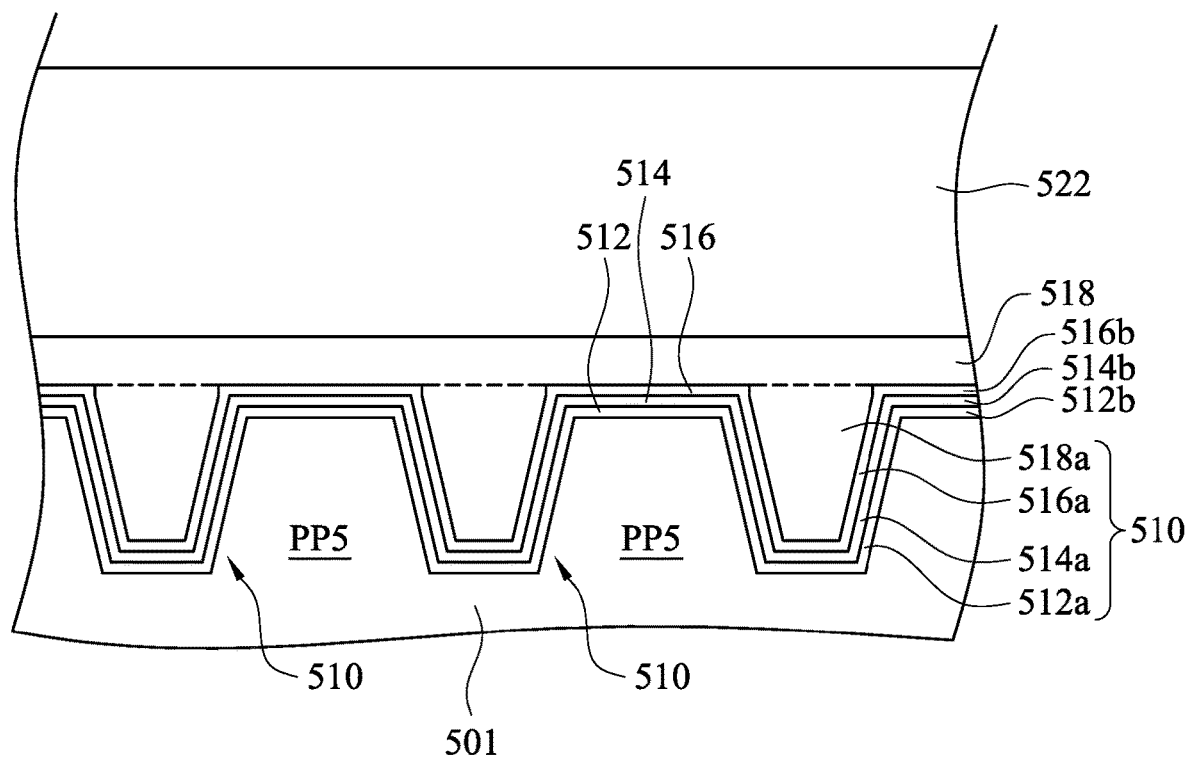

Thereafter, a reflective layer 522 is formed on the dielectric layer 518 as shown in FIG. 5G. The reflective layer 522 is formed by a reflective material capable of reflecting light emitted to the reflective layer 522. In some embodiments, the reflective material includes metal, such as aluminum, tungsten, copper, tantalum, titanium, alloys thereof, or combinations thereof. In some embodiments, the reflective layer 522 can be formed by using a deposition process such as an atomic layer deposition (ALD). Other methods to form the reflective layer 522 include chemical vapor deposition (CVD), physical vapor deposition (PVD), and plasma enhanced chemical vapor deposition (PECVD).

Figure 5H:
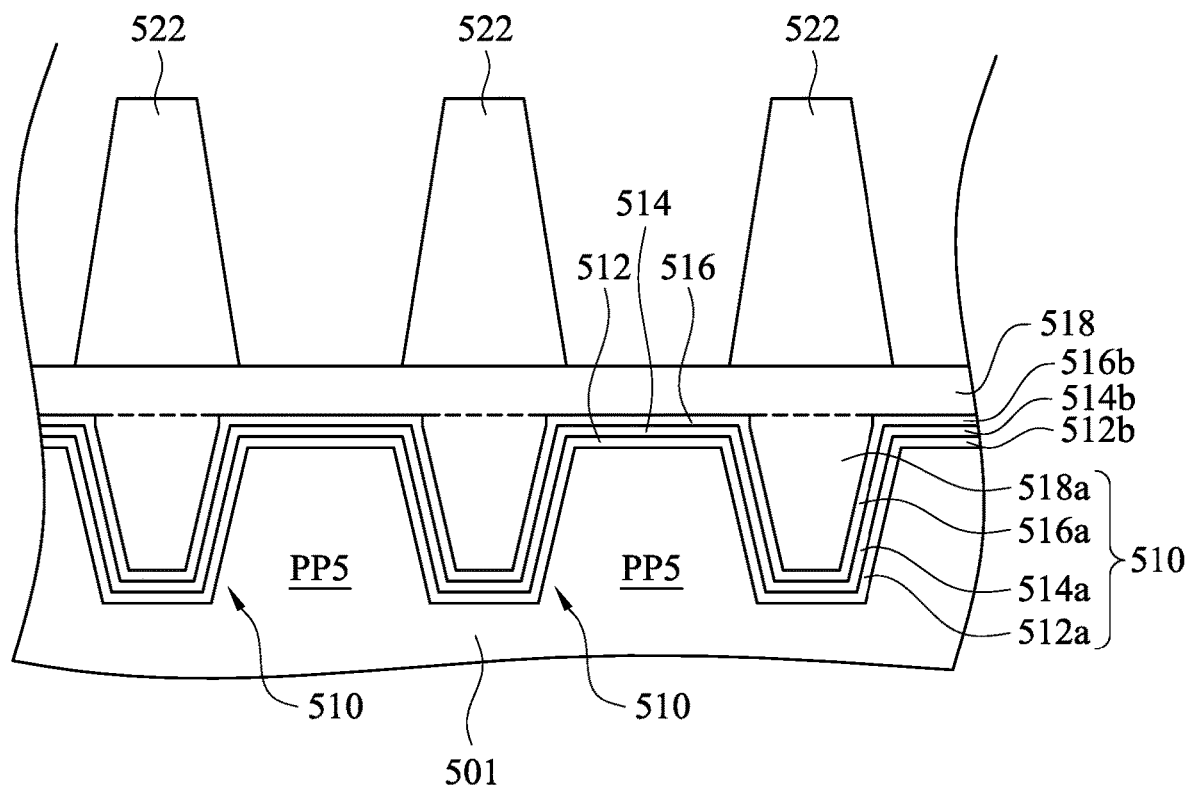

Then, the reflective layer 522 is etched as shown in FIG. 5H. In some embodiments, the reflective layer 522 is etched to have the grid pattern and to be located corresponding to the dielectric post 518. In some embodiments, the reflective layer 522 can be etched by a wet etching process or a dry etching process. However, embodiments of the present disclosure are not limited thereto.

Figure 5I:
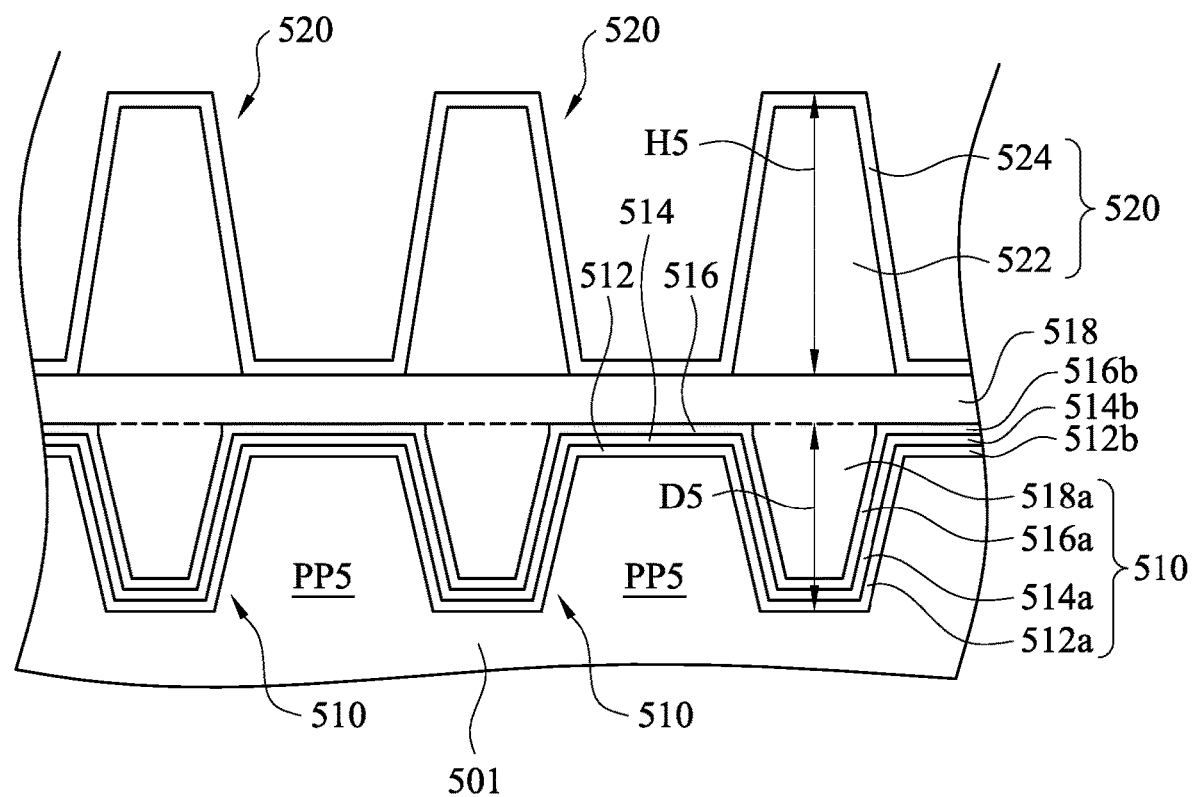

Thereafter, a passivation layer 524 is formed on the etched reflective layer 522 and the dielectric layer 518 as shown in FIG. 5I A portion of the passivation layer 524 is formed to cover the etched reflective layer 522, thereby forming a grid isolation structure 520. In some embodiments, the grid isolation structure 520 is formed to have a structure height H5, and a ratio of the structure depth D5 to the structure height H5 is equal to or greater than about 4, thereby providing better isolation performance for lower crosstalk and corresponding noise. In some embodiments, the ratio of the structure depth D5 to the structure height H5 ranges about 4 to about 9.

Figure 6:
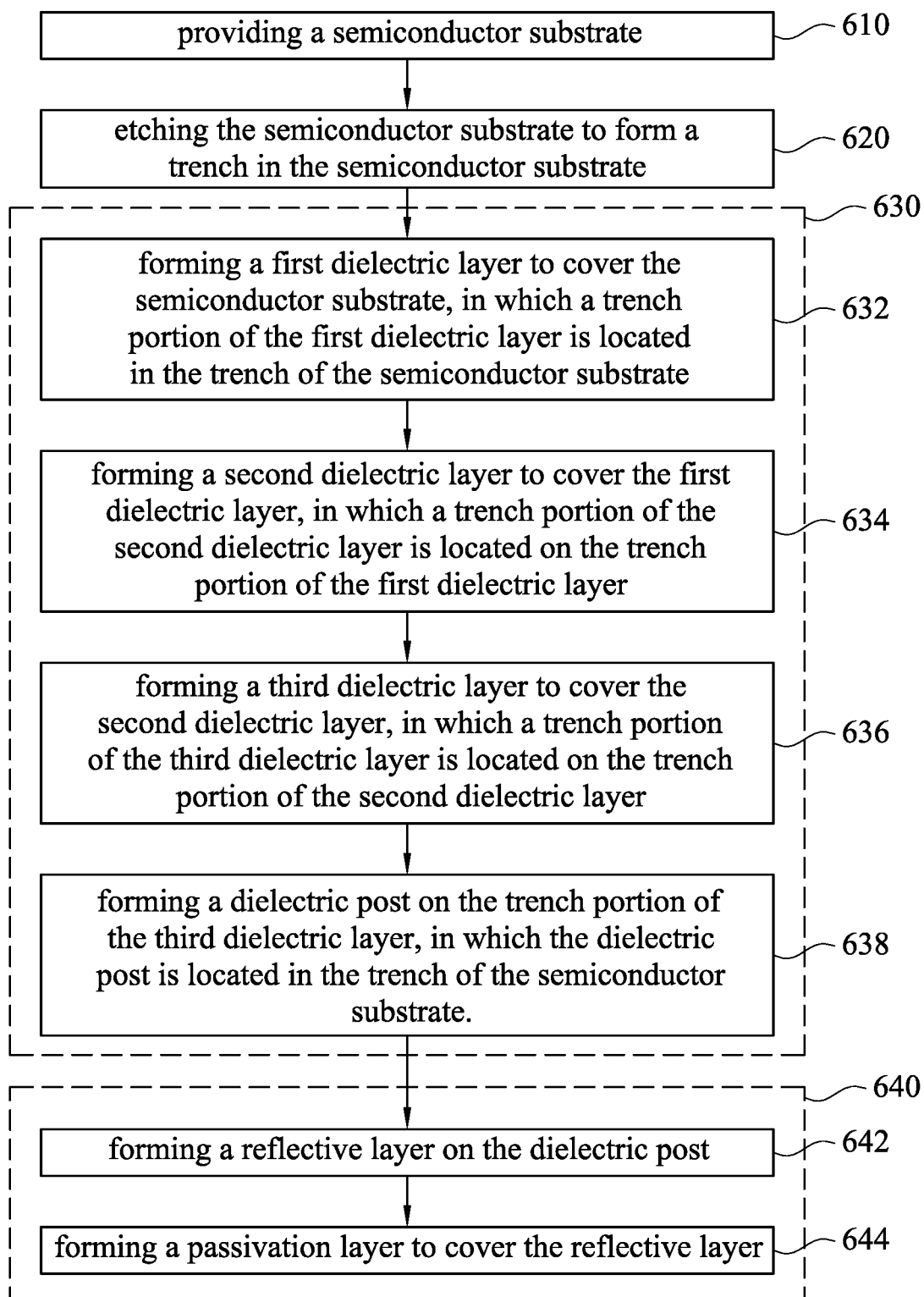
FIG. 6 is a flow chart showing a method for fabricating an isolation structure in accordance with embodiments of the present disclosure.

Referring to FIG. 6, FIG. 6 is a flow chart showing a method 600 for fabricating an optical isolation structure in accordance with embodiments of the present disclosure. The method 300 begins at operation 610. Operation 610 is performed to provide the semiconductor substrate 501 as shown in FIG. 5A.

Then, operation 620 is performed to etch the form the semiconductor substrate 501 to form the trench TR5 in the semiconductor substrate 501 as shown in FIG. 5B.

Thereafter, operation 630 is performed to form a trench isolation structure. In the operation 630, at first, operation 632 is performed to form the first dielectric layer 512 to cover the semiconductor substrate 501 as shown in FIG. 5C, in which the first dielectric layer 512a includes the trench portion 512a located in the trench TR5 of the semiconductor substrate 501.

Then, operation 634 is performed to form the second dielectric layer 514 to cover the first dielectric layer 514 as shown in FIG. 5D, in which the second dielectric layer 514 includes the trench portion 514a covering the trench portion 512a of the first dielectric layer 512 and located in the trench TR5 of the semiconductor substrate 501.

Thereafter, operation 636 is performed to form the third dielectric layer 516 to cover the second dielectric layer 514 as shown in FIG. 5E, in which the third dielectric layer 516 includes the trench portion 516a covering the trench portion 514a of the second dielectric layer 514 and located in the trench TR5 of the semiconductor substrate 501.

Then, operation 638 is performed to form the dielectric post 518a in the trench TR5 of the semiconductor substrate 501 to cover the trench portion 516a of the third dielectric layer 516 as shown in FIG. 5F.

After operation 630 is performed, operation 640 is performed to form a grid isolation structure on the trench isolation structure. In operation 640, at first, operation 642 is performed to form the reflective layer 522 on the dielectric post 518a as shown in FIG. 5G and FIG. 5H. Then, operation 644 is performed to form the passivation layer 524 to cover the etched reflective layer 522 as shown in FIG. 5I.

Figure 7:
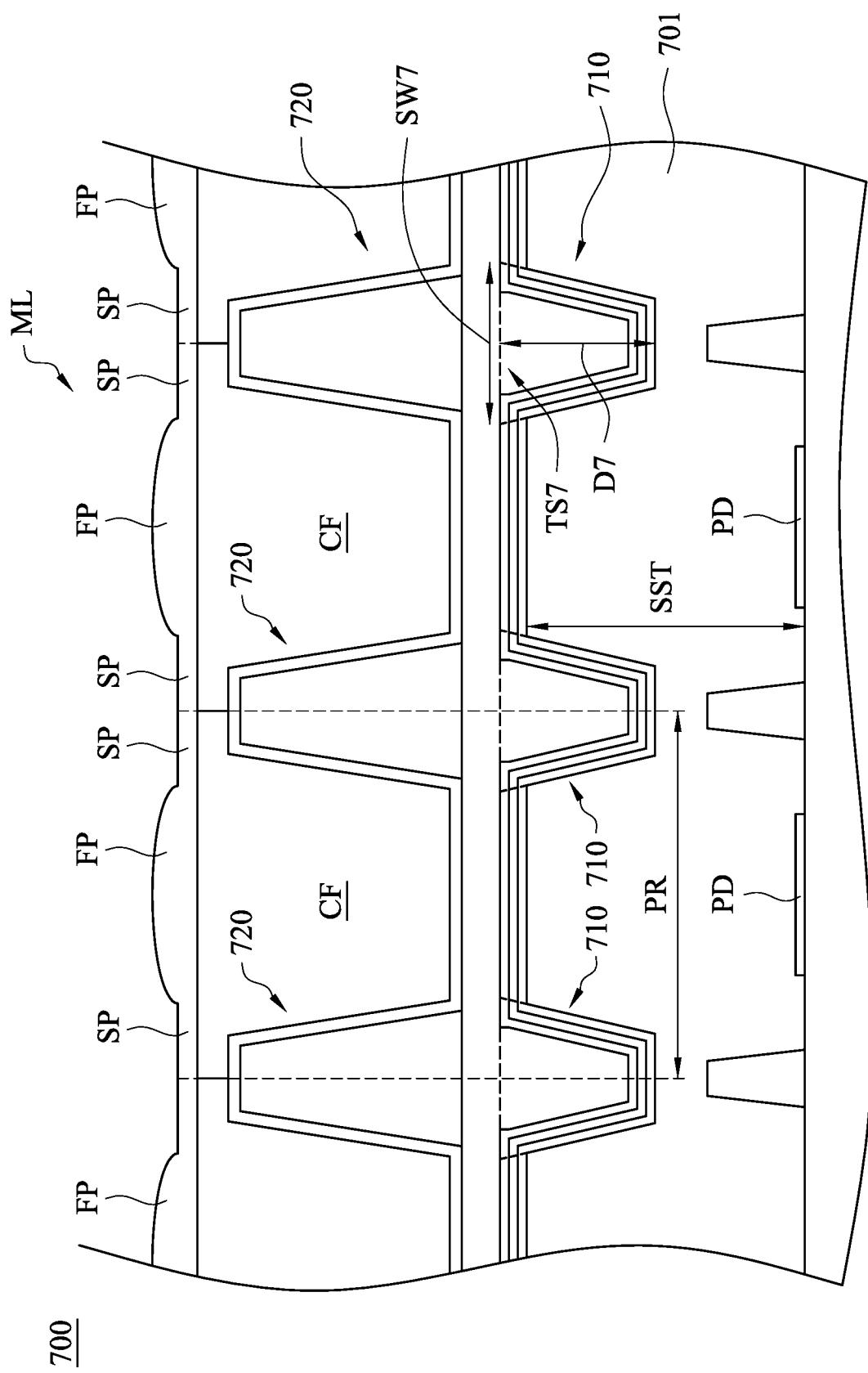
FIG. 7 is a schematic cross-sectional view of an image sensor in accordance with some embodiments of the present disclosure.

Referring to FIG. 7, FIG. 7 is a schematic cross-sectional view of an image sensor 700 in accordance with some embodiments of the present disclosure. In this embodiment, the image sensor 700 is a backside illuminated (BSI) image sensor, but embodiments of the present disclosure are not limited thereto. The image sensor 700 includes a semiconductor substrate 701, a trench isolation structure 710, a grid isolation structures 720, plural color filters CF7, a micro lens layer ML and plural light-sensitive elements PD. The trench isolation structure 710 is disposed in the semiconductor substrate 701 to define plural pixel regions PR on the semiconductor substrate 701. The trench isolation structure 710 is similar to the trench isolation structure 110, 210, 410 or 510, and the grid isolation structure 720 is similar to the grid isolation structures 420, or 520.

The color filters CF and the micro lens layer ML are disposed on the pixel regions PR. The micro lens layer ML is conjured to collect light for the image sensor 700. The micro lens layer ML includes plural first portions FP and plural second portions SP located between the first portions FP, and the second portions SP of the micro lens layer ML located on the grid isolation structure 720.

The light-sensitive elements PD are disposed corresponding to the pixel regions PR9. In this embodiment, the light-sensitive elements PD are photodiodes, but embodiments of the present invention are not limited thereto.

In some embodiments, the semiconductor substrate 701 has a substrate thickness SST and the trench isolation structure 710 has a structure depth D7, and a ratio of the structure depth D7 to the substrate thickness SST is designed to be equal to or greater than about 0.4, thereby providing better isolation performance. In some embodiments, the ratio of the structure depth D7 to the substrate thickness SST ranges from about 0.4 to about 0.8.

In some embodiments, the trench isolation structure 710 has a top surface TS7. The top surface TS7 has a surface width SW7. A ratio of the surface width SW7 to a pixel width of the pixel region PR is designed to be equal to or smaller than about 0.3. In some embodiments, the ratio of the surface width SW7 to the pixel width of the pixel region PR ranges from about 0.05 to about 0.3.

Because the trench isolation structure 710 is similar to the trench isolation structure 110, 210, 410 or 510, the trench isolation structure 710 has a greater depth capable of providing better isolation performance for lower crosstalk and corresponding noise. Therefore, optical confinement, QE, and SNR (signal to noise ratio) of the image sensor 700 are improved accordingly.

In accordance with an embodiment of the present disclosure, the present disclosure discloses a device including a semiconductor substrate, a light-sensitive element, an isolation structure and a color filter. The semiconductor substrate has opposite first and second surfaces. The light-sensitive element is disposed in the first surface of the semiconductor substrate. The isolation structure is disposed in the second surface of the semiconductor substrate, in which the isolation structure includes a dielectric filler and a first dielectric layer wrapping around the dielectric filler. The color filter is disposed over the semiconductor substrate.

In accordance with an embodiment of the present disclosure, the present disclosure discloses a device including a semiconductor substrate, a light-sensitive element, an isolation structure and a color filter. The semiconductor substrate has opposite first and second surfaces. The light-sensitive element is disposed in the first surface of the semiconductor substrate. The isolation structure is disposed in the second surface of the semiconductor substrate, in which the isolation structure includes a filler, a first dielectric layer wrapping around the filler, a second dielectric layer between the first dielectric layer and the semiconductor substrate, and a third dielectric layer between the second dielectric layer and the semiconductor substrate. The color filter is disposed over the semiconductor substrate.

In accordance with another embodiment of the present disclosure, the present disclosure discloses a device including a semiconductor substrate, a light-sensitive element, a first dielectric layer, a second dielectric layer and a color filter. The semiconductor substrate has opposite first and second surfaces. The light-sensitive element is disposed in the first surface of the semiconductor substrate. The first dielectric layer has a first portion over the second surface of the semiconductor substrate and at least one second portion in the semiconductor substrate. The second dielectric layer is disposed between the first dielectric layer and the semiconductor substrate. The color filter is disposed over the first portion of the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a semiconductor substrate having opposite first and second surfaces;
a light-sensitive element in the first surface of the semiconductor substrate;
an isolation structure in the second surface of the semiconductor substrate, wherein the isolation structure comprises a dielectric filler and a first dielectric layer wrapping around the dielectric filler;
a color filter over the semiconductor substrate; and
a grid around the color filter and substantially aligned with the isolation structure.

2. The device of claim 1, wherein a ratio of a depth of the isolation structure to a height of the grid is equal to or greater than about 4.

3. The device of claim 1, wherein the first dielectric layer comprises a high-k material.

4. The device of claim 1, further comprising:
a second dielectric layer between the first dielectric layer and the semiconductor substrate.

5. The device of claim 4, further comprising:
a third dielectric layer between the second dielectric layer and the semiconductor substrate.

6. The device of claim 1, wherein the first dielectric layer has a portion over the second surface of the semiconductor substrate.

7. The device of claim 1, wherein a ratio of a depth of the isolation structure to a width of a top surface of the isolation structure is equal to or greater than about 5.

8. The device of claim 1, wherein a ratio of a depth of the isolation structure to a thickness of the semiconductor substrate is equal to or greater than about 0.4.

9. The device of claim 4, wherein a dielectric constant of the second dielectric layer is smaller than a dielectric constant of the first dielectric layer.

10. A device, comprising:
a semiconductor substrate having opposite first and second surfaces;
a light-sensitive element in the first surface of the semiconductor substrate;
an isolation structure in the second surface of the semiconductor substrate, wherein the isolation structure comprises a filler, a first dielectric layer wrapping around the filler, a second dielectric layer between the first dielectric layer and the semiconductor substrate, and a third dielectric layer between the second dielectric layer and the semiconductor substrate; and
a color filter over the semiconductor substrate.

11. The device of claim 10, wherein a normalized areal oxygen density of the third dielectric layer is greater than a normalized areal oxygen density of the second dielectric layer.

12. The device of claim 10, wherein a flat band voltage of the third dielectric layer is greater than a flat band voltage of the second dielectric layer.

13. The device of claim 10, wherein a dielectric constant of the third dielectric layer is smaller than a dielectric constant of the second dielectric layer.

14. The device of claim 10, wherein a dielectric constant of the second dielectric layer is smaller than a dielectric constant of the first dielectric layer.

15. The device of claim 10, wherein a band gap value of the third dielectric layer is greater than a band gap value of the second dielectric layer.

16. The device of claim 10, wherein a band gap value of the second dielectric layer is greater than a band gap value of the first dielectric layer.

17. A device, comprising:
a semiconductor substrate having opposite first and second surfaces;
a light-sensitive element in the first surface of the semiconductor substrate;
a first dielectric layer having a first portion over the second surface of the semiconductor substrate and at least one second portion in the semiconductor substrate;
a second dielectric layer between the first dielectric layer and the semiconductor substrate; and
a color filter over the first portion of the first dielectric layer.

18. The device of claim 17, further comprising a grid over the first portion of the first dielectric layer, and the grid is substantially aligned with the at least one second portion of the first dielectric layer.

19. The device of claim 17, further comprising:
a third dielectric layer between the second surface of the semiconductor substrate and the second dielectric layer.

20. The device of claim 19, further comprising:
a fourth dielectric layer between the second surface of the semiconductor substrate and the third dielectric layer.

* * * * *